May 25, 1965 R. D. GOODIN 3,185,897

ELECTRONIC CIRCUIT BOARD

Filed June 9, 1961 2 Sheets-Sheet 1

INVENTOR.
ROBERT D. GOODIN
BY
Townsend and Townsend.
ATTORNEYS

May 25, 1965 R. D. GOODIN 3,185,897

ELECTRONIC CIRCUIT BOARD

Filed June 9, 1961 2 Sheets-Sheet 2

INVENTOR.
ROBERT D. GOODIN

BY

Townsend and Townsend
ATTORNEYS

3,185,897
ELECTRONIC CIRCUIT BOARD

Robert D. Goodin, 2025 Mercury Way, Sacramento 25, Calif.

Filed June 9, 1961, Ser. No. 116,190
2 Claims. (Cl. 317—101)

This invention relates to a board carrying electronic components and to an arrangement for interconnecting the components in various ways so as to effect different electrical and electronic circuit combinations.

It is many times desirable to provide a physical arrangement of various circuit components set out on a board in such a way as to render them readily adaptable to be interconnected by means of jumper cables and the like to effect selected circuit combinations.

Such devices are particularly useful as teaching aids wherein it is possible for an instructor to vary circuit conditions by merely changing the connection of the various jumpers.

Many devices of this type have been developed previously to accomplish this broad purpose. However, all the previously developed devices have certain deficiencies which the present invention is designed to overcome.

The instant invention comprises a separate wire jumper or terminal box carrying the jumper cables and a circuit board which is arranged to be mounted over the terminal box in such a way that the jumpers carried within the terminal box can be connected to the various circuit components carried by the circuit board to effect inter-circuit connections.

One of the features and advantages of this invention is that each of the jumpers is provided with a clip on one end and is permanently connected to the interior of the terminal box at the other end. Because of this structural combination there is no possibility of losing or otherwise misplacing the various jumper cables.

Another feature and advantage of this invention lies in the fact that two or more of the jumpers carried within the terminal box are interconnected together so that the connection of one circuit component to another is effected by connecting one of the interconnecting cables to one of the circuit components and the other connected cable to the other circuit component.

In all previous circuit boards of the type employed in this invention it is necessary to stack connecting cables on a given terminal if the terminal is to be connected to more than one other component in the end circuit.

One of the advantages of this invention is to provide in the circuit board and junction box the interconnection of a plurality of cables so that a single cable connected to a given component provides the juncture within the terminal or junction box for allowing that component to be connected to a plurality of other circuit components.

Another object of this invention is to provide a novel terminal or junction box comprising a plurality of spaced apart parallel walls spaced a distance apart slightly greater than the width of the cables to be used with the box and in which a plate is mounted above the box having apertures aligned over the respective spaces between panels. Wires are then connected so as to drape within the space between panels and extend upwardly through the holes in the top plate. By this means the wire can be inserted and drawn from the hole with a minimum of effort due to the fact that the wire is guided upon entry and extraction through the hole by the plates.

A further feature and advantage of this invention is that a plurality of wires can be independently aligned with the respective plurality of holes in the upper portion of the junction box and each of the wires can be guided by selected spaces between the parallel walls under the plate. This eliminates any possibility of wires tangling or jamming and thus facilitates the easy insertion and withdrawal of the wires within the box.

Still a further feature and advantage of this invention lies in the fact that the circuit board is easily removable from association with the terminal or junction box. Because of this feature a selection of circuit boards having different circuit components mounted thereon can be used with a common terminal box thus increasing the flexibility of the device.

A still further feature and advantage of this invention lies in its flexibility in that it can be used for purposes such as teaching aids wherein various circuit configurations can be constructed by merely changing the circuit connection of the components or the device can be used in mock up for breadboard circuit design problems where a rapid change of circuit values can be obtained for experimental purposes. The device also has utility in providing resistive, capacitive and inductive networks wherein a practically unlimited combination of resistive, capacitive and inductive combinations can be obtained.

A further object and advantage of this invention is that the terminal box is located in the geometric center of the circuit board so that the jumper cables within the junction box are substantially equidistant from all the circuit components within the board. This provides a condition in which all circuit components can be reached by the jumper cables without having any of the cables of substantially more length than is necessary to make the connection.

Other objects of the present invention will become apparent upon reading the following specification and referring to the accompanying drawings in which similar characters of reference represent corresponding parts in each of the several views.

Figure 1:
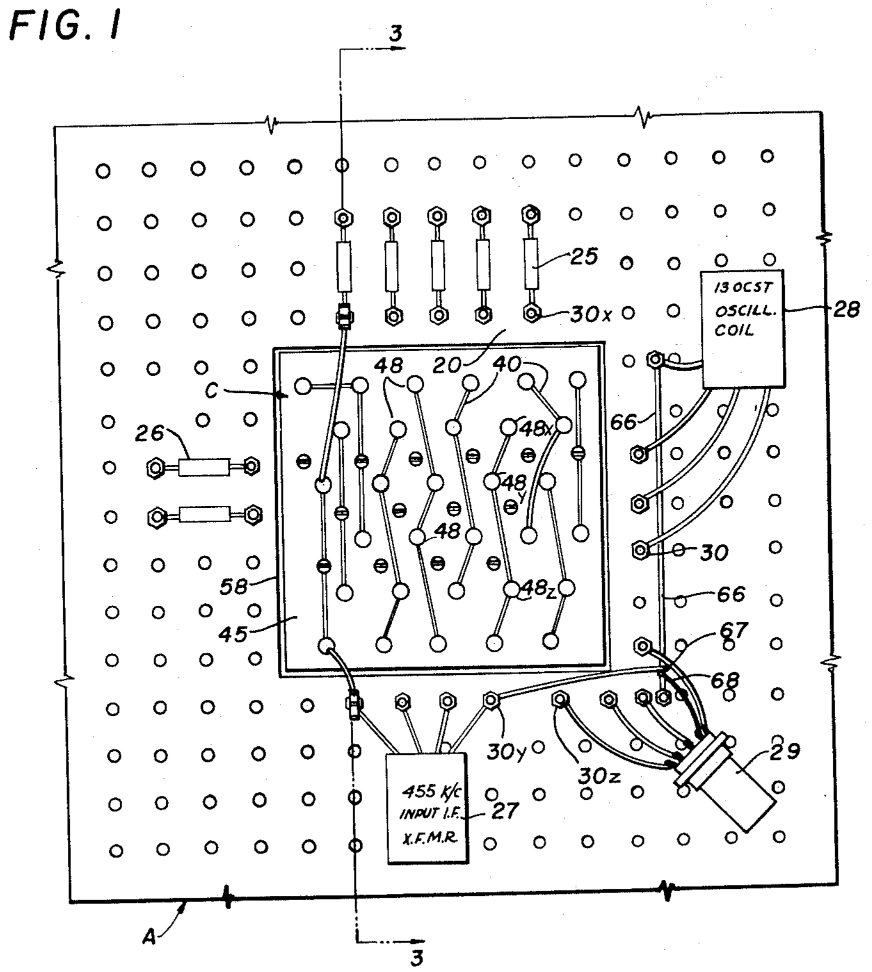
FIG. 1 is a top plan view showing the circuit board and junction or terminal box of this invention.

In the principal embodiment of this invention there is provided a circuit board generally indicated at A mounted on a box B and having a central terminal or junction box C located in the center of box B and having its top face 20 in the center of circuit board A.

Circuit board A is provided with a plurality of electronic components such as resistors 25, condensers 26, transformers 27, coils 28 and tubes 29.

The various terminals of circuit components such as the resistors, condensers, transformers, coils and tubes are connected directly to connector terminals 30. Each of the respective leads from the various circuit components are connected to one of the terminals 30. Selected terminals 30 can then be connected together by means of jumper cables 35.

Jumper cables 35 are arranged with one end of each cable connected to the inside of terminal box C and the opposite end is provided with an alligator type clip 39 by which jumper cables 35 can be connected to respective terminals 30. Interconnection of one of the terminals 30 to another terminal is effected by the connection of several of the jumper cables 35 together within the terminal box. Therefore one of a pair of interconnected jumper cables 35 can be connected to one of the terminals 30 and the other of the interconnected pair can be connected to another terminal 30.

In the top plan view of FIG. 1 lines indicated at 40 are drawn on the top plate 45 of junction box C to indicate to the operator of the device which ones of the cables of jumper cables 35 are interconnected. It can be seen that lines 40 pass through and in alignment with the respective apertures 48 in which the respective cables or jumpers are nested. For example, jumper cable 35 nested in aperture 48X could be connected to terminal 30X. The cable nested within aperture 48Y could be connected to terminal 30Y and the cable nested within aperture 48Z could be connected to terminal 30Z. In this way due to the fact that line 40 shows an interconnection of all the jumpers 48X, 48Y and 48Z respectively from a common bus it would be apparent that terminals 30X, 30Y and 30Z will be interconnected.

Figure 3:
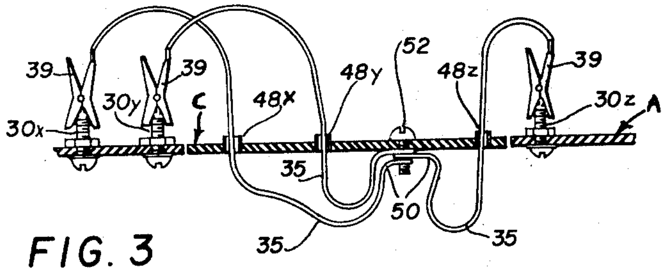
FIG. 3 is a cross-sectional view illustrating the connection of jumper cables within the junction box and their relationship in connection to various circuit components.
Figures 2, 4, 5:
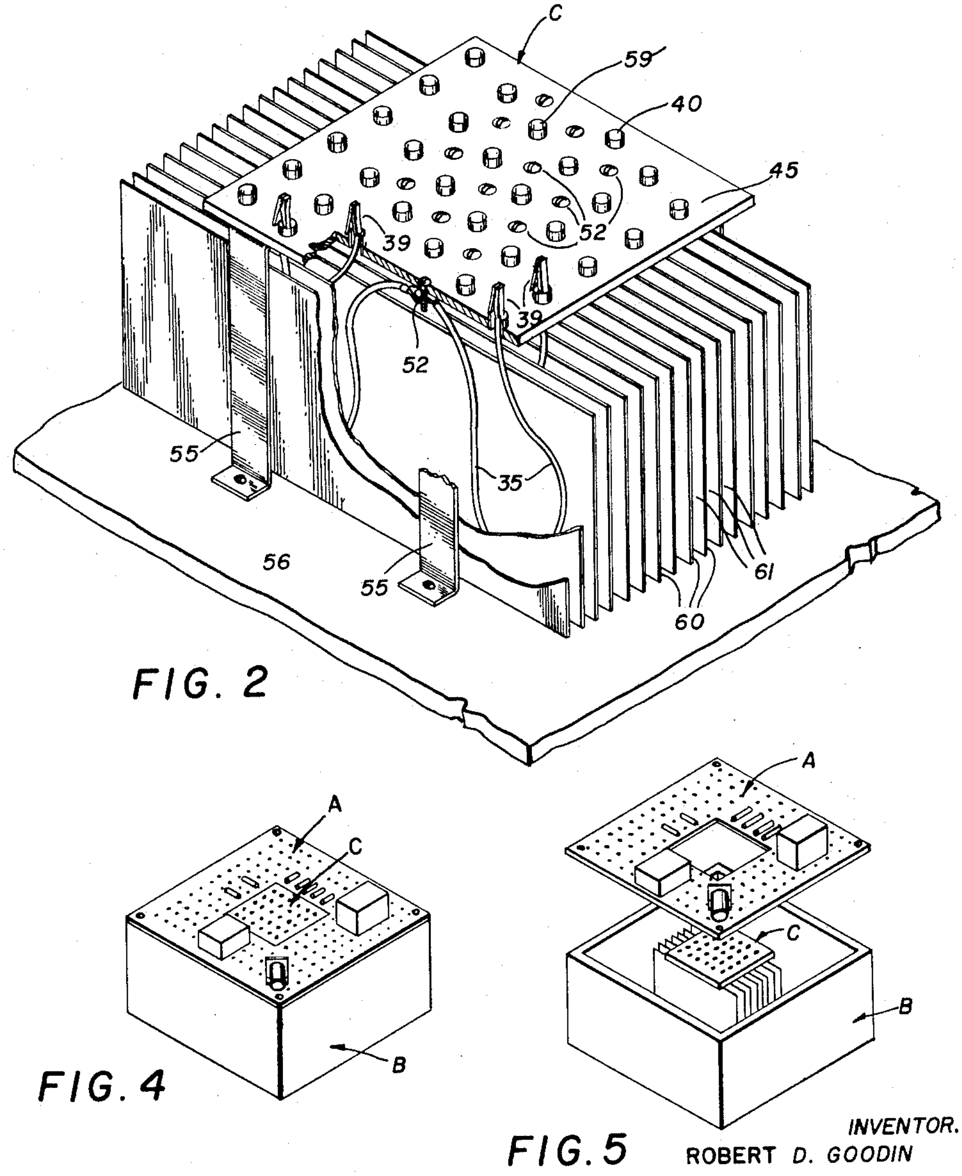
FIG. 2 is a perspective view showing the inner structure of the junction or terminal box.
FIG. 4 is a perspective view showing the complete assembly of the invention with the circuit board installed in working relationship with the junction box.
FIG. 5 is a view similar to FIG. 4 but with the circuit board shown in exploded relation to the junction box.

FIG. 3 illustrates how the inside end 50 of each of the jumper cables 35 are connected together within junction box C. The bus in this case comprises a nut and bolt 52 which ties all the jumper cables 35 passing through apertures 48X, 48Y and 48Z respectively together. When it is desired to have a plurality of more than two wires interconnected within the junction box it may be desirable to interconnect several nuts and bolts 52 together so that the wires will be properly aligned with their respective associated guideways 61.

Junction box C is provided with top plate 45 supported from two U-shaped supports 55 mounted on the bottom 56 of box B. Alternatively the supports 55 may have their webs broken so that they do not extend across the working area of the box taking on the shape of a broken U or a modified Z. Supports 55 hold or support plate 45 in elevational alignment with circuit board A and is positioned to mate with the rectangular aperture 58 formed in the central portion of the circuit board.

Apertures 48 within terminal box C are equidistantly spaced and are provided with guide sleeves 59 to assist in guiding jumper cables 35. Underneath the face plate of plate 45 there is provided a plurality of vertical spaced apart parallel wall members 60 forming between each of the wall members a guideway 61. Each of the wires passing through each of the apertures 48 is guided within one of the guideways 61 so that jumper cable 35 has an unobstructed vertical path within the guideway to allow for its ready insertion and removal.

The opposite end of each jumper cable 35 is connected to a nut and bolt combination 52 carried by plate 45 so that there is a limitation as to how far the jumper cable can be withdrawn from the aperture. However, the length of each jumper cable is sufficient to be able to reach each of the terminals 30 carried by the circuit board A. Thus all the jumper cables within the junction box can be completely depressed into guideway 61 and can be withdrawn sufficiently to connect to any one of the terminals 30 on the circuit board.

Plate 45 is fixed sufficiently over the top of wall member 60 to allow jumper cables 35 to be connected to a common nut and bolt combination 52 which may be out of alignment with the particular guideway in which the wire is designed to nest and still allow the jumper cable to nest within its preselected guideway.

The spacing between plate 45 and the top of wall members 60 should not be sufficient to allow the jumper cables to be misplaced or fall out of alignment with its preselected guideway.

It can be seen that this combination can be varied in many ways without departing from the scope of the invention. If for example in many circuit combinations certain common terminals of various components are virtually always connected together if connected into the circuit at all. When such is the case an exterior common bus such as a ground bus 65 can be provided on the outer face of circuit board A, and the various circuit components such as indicated at 66, 67 and 68 can be permanently connected to the bus 65. This would provide a certain amount of permanent interconnection between components without detracting from the flexibility of circuit changes.

It is also believed apparent that the circuit board A used with the device could be changed to provide attachments for different arrangements or components so that the device could be used for a multiplicity of purposes. For example, it may be desirable to connect randomly selected resistors, capacitors and inductances to the respective terminals 30 so that jumper cables 35 could be later employed to interconnect the selected of the resistors, condensers and inductances together to make certain circuit sub-combinations useful in design work.

In utilizing the device as an instructing aid a particular circuit board A having the basic components of, for example, RF circuit combinations could be arranged wherein the instructor can interconnect jumper cables 35 to provide such combinations as an RF oscillator, the front end or RF section of a radio receiver, a lesser circuit or virtually any circuit which can be constructed from the components that are mounted on the board. It is also apparent that power supply could be mounted internally within box B and connected to terminal leads extending through jumper box C so that power connections could be self-contained for connection to the circuit components in the same manner as jumpers are used for interconnection of components.

Although the foregoing invention has been described and claimed by way of illustration and example for purposes of clarity of understanding, it is understood that certain changes and modifications may be practiced within the spirit of the invention as limited only by the scope of the appended claims.

In the claims:

1. An electronic circuit board for carrying electronic components in such a way that they can be removably connected to each other to obtain selected electronic circuits, comprising a board formed with a centrally located aperture, electrical components mounted on said board, connector terminals mounted on said board, electronic components connected to said connector terminals, jumper wire support means, a face plate covering said jumper wire support means, means to mount said board over said jumper wire support means with the face plate being located within the aperture of said board and aligned in substantially coplanar relation with said board, a plurality of ports formed in said face plate, a plurality of jumper wires carried within said jumper wire support means, each of said jumper wires projecting outwardly from one of said ports, and clip means mounted on the exterior end of each said jumper wire, each said wire being of sufficient length to enable the clip means connected to the wire to connect to any of said connector terminals on said board, each of said wires electrically connected to at least one other said wire within said jumper wire support means, the interior of said jumper wire support means formed with a plurality of spaced apart parallel vertical walls, the spacing between said walls being slightly larger than the thickness of said jumper wires, each of said jumper wires being aligned to nest between a pair of said vertical walls whereby the vertical walls form guides to mechanically separate the respective wires from each other within the jumper wire support means.

2. An electronic circuit board for carrying electronic components in such a way that they can be removably connected to each other to obtain selected electronic circuits comprising jumper wire support means formed by a plurality of spaced apart parallel vertical walls, a horizontal face plate, means to mount said horizontal face plate in spaced relation over the top of said vertical walls, a plurality of wires connected to the bottom of said face plate, a plurality of ports formed by said face plate, each of said wires forming a depending loop from its mounting point on the face plate within the space between said vertical walls and extending upwardly through one of said ports, clip means mounted on the exterior end of each of said wires, and electronic circuit mounting means mounted radially around said jumper wire support means and said jumper wires being of sufficient length to allow the clip connectors to be connected to each of said circuit components.

References Cited by the Examiner

UNITED STATES PATENTS

| | | | |
|---|---|---|---|
| 336,563 | 2/86 | Gilliland | 317—112 |
| 2,417,420 | 3/47 | Knapp | 339—198.3 |
| 2,592,552 | 4/52 | De Florez et al. | 339—17 |

JOHN F. BURNS, *Primary Examiner.*